United States Patent
Huang

(12) 
(10) Patent No.: US 6,221,713 B1
(45) Date of Patent: Apr. 24, 2001

(54) APPROACH FOR SELF-ALIGNED CONTACT AND PEDESTAL

(75) Inventor: Jenn Ming Huang, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/261,995

(22) Filed: Mar. 5, 1999

(51) Int. Cl.[7] .............................................. H01L 21/8242
(52) U.S. Cl. ........................... 438/241; 438/624; 438/970
(58) Field of Search .................................. 438/210, 241, 438/253, 396, 624, 634, 970

(56) References Cited

U.S. PATENT DOCUMENTS

| | | | |
|---|---|---|---|
| 5,219,793 | * 6/1993 | Cooper et al. | 438/624 |
| 5,488,011 | 1/1996 | Figura et al. | 437/60 |
| 5,631,179 | 5/1997 | Sung et al. | 438/264 |
| 5,700,706 | 12/1997 | Juengling | 437/52 |
| 5,702,990 | 12/1997 | Jost et al. | 438/618 |
| 5,712,201 | 1/1998 | Lee et al. | 438/239 |
| 5,946,569 | * 8/1999 | Huang | 438/238 |

* cited by examiner

Primary Examiner—Chandra Chaudhari
(74) Attorney, Agent, or Firm—George O. Saile; Stephen B. Ackerman

(57) ABSTRACT

A method for forming bit-line and charge-node contact holes that eliminates effects of misalignment when contact etching these holes. A liner is deposited that arrests the etch from burning through the deposited polysilicon and damage the word-line and passgate transistor of a DRAM structure should misalignment occur in the formation of these structures and their surrounding contact plugs. This liner at the same time relaxes restrictions of tolerance for the process of the creation of such holes.

30 Claims, 5 Drawing Sheets

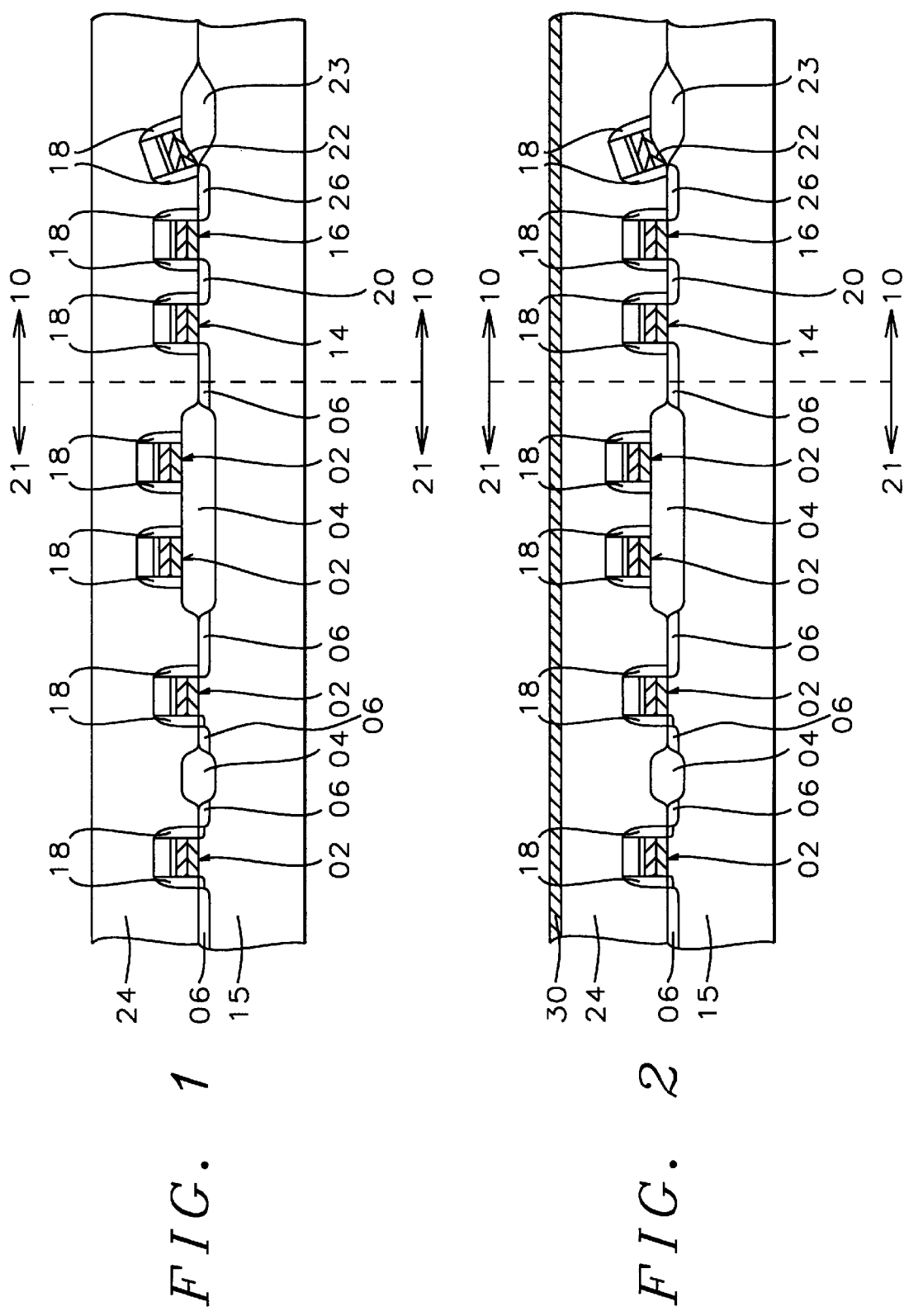

APPROACH FOR SELF-ALIGNED CONTACT AND PEDESTAL

BACKGROUND OF THE INVENTION

(1) Field of the Invention

The invention relates to the fabrication of semiconductor circuits and more specifically to a method of creating bit-line and charge node contacts for embedded DRAM circuitry.

(2) Description of the Prior Art

Self-alignment is a technique in which multiple levels of regions on the wafer are formed using a single mask, thereby eliminating the alignment tolerances required by additional masks. This approach has been used more often as circuit dimensions decrease. There are many examples of this technique, one of the earliest and most widely used is the self-aligned source and drain implant to the poly gate. Self-aligned contacts are often used in memory cells where contacts are limited only by the spacers and field oxide bird's beak or a contact window-landing pad. Therefore, the mask contact window can be oversized and no contact borders are needed, resulting in significant space savings.

As transistor dimensions approached 1 um, the conventional contact structures used up to that point began to limit device performance in several ways. First it was not possible to limit the contact resistance if the contact hole was also of minimum size while problems with cleaning the contact hole also arose. In addition, the area of the source/drain region could not be minimized because the contact hole had to be aligned to these regions with a separate masking step and extra area had to be allocated for misalignment. The technique of producing several small, uniform sized contact holes was also used, the reason for this being that if all contact holes are of uniform size, they are more likely to clear simultaneously during the etching process. The problem with this latter approach is that the full width of the source/drain region is not available for the contact structure. As a result, the device contact resistance was proportionally larger than it would have been in a device having minimum width.

A variety of alternative contact structures have been investigated in an effort to alleviate this problem. Among these are self-aligned salicides on the source/drain region, elevated source/drain regions, buried-oxide MOS contacts and selectively deposited layers of metal in the contact holes.

As the density of circuit components contained within a semiconductor die has increased and the circuit components have decreased in size and are spaced closer together, it has become increasingly difficult to access selectively a particular region of the silicon wafer through the various layers that are typically superimposed on the surface of the silicon wafer without undesired interference with other active regions.

It is especially important to have a technology that can etch openings that have essentially vertical walls, most notably when the openings are to extend deeply into the surface layers. Special care must also be taken to insure that the profile of the lower section or bottom of the opening resembles a straight line in order to reduce thickness difference in the underlying layers. To this end, it is critically important to select a stop layer (that has a restraining influence on the etching process) within the semiconductor structure that enhances the linearity or straight-line profile of the bottom of the etched hole.

Additionally, to tolerate some misalignment in the masks used to define such openings, it is advantageous to provide protection to regions that need isolation but that inadvertently lie partially in the path of the projected opening. To this end it is sometimes the practice to surround such regions with a layer of material that resists etching by the process being used to form the openings. Accordingly, a technology that provides the desired results will need an appropriate choice both in the materials used in the layers and the particular etching process used with the materials chosen.

Dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic. This makes possible etching with nearly vertical sidewalls.

Basically, in plasma etching as used in the manufacturing of silicon integrated devices, a silicon wafer on whose surface have been deposited various layers, is positioned on a first electrode in a chamber that also includes a second electrode spaced opposite the first. As a gaseous medium that consists of one or more gasses is flowed through the chamber, an r-f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved.

While elaborate theories have been developed to explain the plasma process, in practice most such processes have been developed largely by experimentation involving trial and error of the relatively poor predictability of results otherwise.

Moreover, because of the number of variables involved and because most etching processes depend critically not only on the particular materials to be etched but also on the desired selectivity and anisotropy, such experimentation can be time consuming while success often depends on chance.

The present invention teaches an improved method of creating a borderless pedestal that can be used for bit-line contact and charge-node contact.

U.S. Pat. No. 5,631,179 (Sung et al.) shows self aligned contacts (SAC) for a flash memory.

U.S. Pat. No. 5,712,201 (Lee et al.) teaches a SAC poly plug process for a DRAM.

U.S. Pat. No. 5,702,990 (Jost et al.) teaches a poly plug contact for a bit line.

U.S. Pat. No. 5,700,706 (Juengling) discloses a process of SAC poly plug contacts.

U.S. Pat. No. 5,488,001 (Figura et al.) teaches SAC plug processes having a barrier layer 43 for node contacts.

SUMMARY OF THE INVENTION

It is the primary objective of the invention to provide a method of creating ultra-small border-less charge-node points and pedestals.

It is another objective of the invention to provide a method of creating ultra-small bit-line contact points and pedestals.

It is another objective of the invention to provide a method of creating ultra-small charge-node contact points and pedestals.

The invention presents a method for forming a contact between vertical structures. The invention teaches the formation of bit-lines by the deposition of poly-1 with hard mask definition, spacer formation and the deposition and planarization of a layer of $SiO_2$. A liner is deposited on top of the $SiO_2$ after which self-aligned contact openings are formed. Plugs are formed within the contact openings after which bit-line and charge-node contacts are formed. The critical point in the indicated sequence is the deposition of the liner. Without this liner, misalignment of the bit-line contact or the (capacitor) charge node contact may result in etching through the poly-1 or the substrate.

BRIEF DESCRIPTION OF THE DRAWINGS

FIG. 1 shows the definition of the poly-1, the spacer formation and the deposition and planarization of the $SiO_2$.

FIG. 2 shows the liner deposition.

DETAILED DESCRIPTION OF THE PREFERRED EMBODIMENTS

Figure 3:
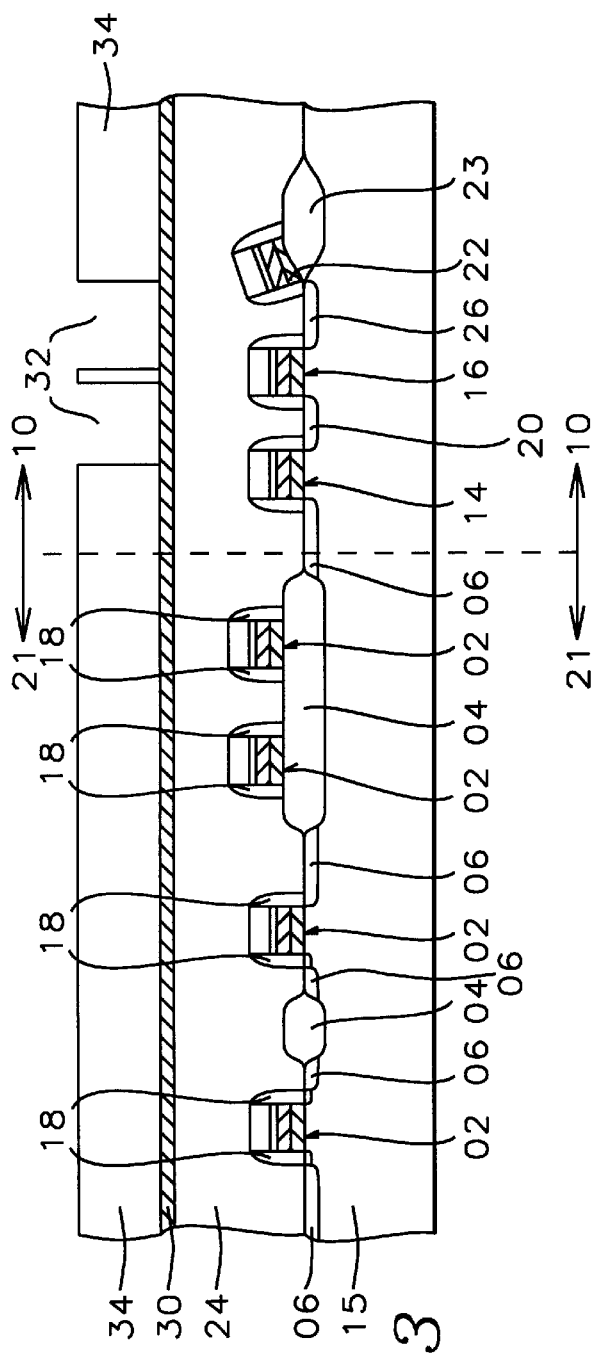
FIG. 3 shows the formation of the self-aligned contacts.

Referring now specifically to FIG. 1 there is shown a cross section of a typical DRAM, section 10 and the supporting DRAM logic functions, section 21. In the DRAM section 10 are shown the word line gate transistor 14 and the passgate transistor 16, gate electrode spacers 18, the diffusion region 20 for the bit line contact, the diffusion region 26, DRAM capacitor 22, a field isolation film 23. A layer 24 of $SiO_2$ is deposited over the DRAM and logic structures, the DRAM and logic structures are formed in substrate 15. For the logic functions 21 are indicated gate electrodes 02, field isolation films 04, source and drain regions 06 and gate spacers 18.

A DRAM cell consists of one transistor and one storage capacitor. As component density has increased, the amount of charges needed for a sufficient noise margin has remained the same. Therefore, in order to increase the specific capacitance, the capacitor is stacked on top of the access transistor.

In a typical DRAM construction, an $n^+$ diffused region in the semiconductor substrate serves as the bit line and an aluminum line (not shown) serves as the word line. The bit line diffused region makes, in such a construction, contact with the $n^+$ diffused source region of the access transistor. A contact between the word line and the polysilicon gate of the access transistor is also made. Details of the latter DRAM are as follows: FIG. 1 shows the word line and passgate transistors 14 and 16, the diffusion region 20 for the bit line contact and the diffusion region 26 for the charge node contact. Further shown are the formation of the gate electrode/capacitor spacers 18 and the deposition and planarizing of a layer 24 of $SiO_2$. The spacers can be formed using $SiO_2$, SiON or $Si_3N_4$. The DRAM structure is created within the surface of a semiconductor substrate 15.

FIG. 2 shows the deposition of the liner 30 across the top surface of the planarized layer 24. The liner may contain for example SiON or $Si_3N_4$. Liner 30 typically has a thickness within the range of between 40 and 200 Angstrom.

FIG. 3 shows the deposition, patterning and etching of photo resist 34 to form the self-aligned contact openings 32.

Figure 4:
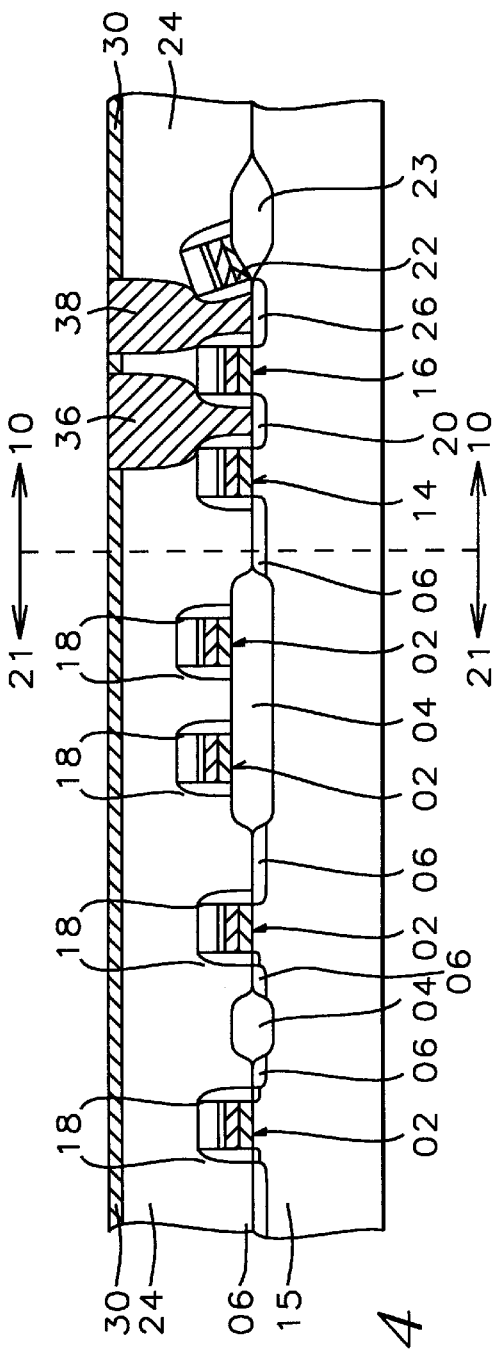
FIG. 4 shows the plug formation.

FIG. 4 shows the formation of the contact plugs 36 and 38 in alignment with the previously created contact openings 32 (FIG. 3).

Figure 5:
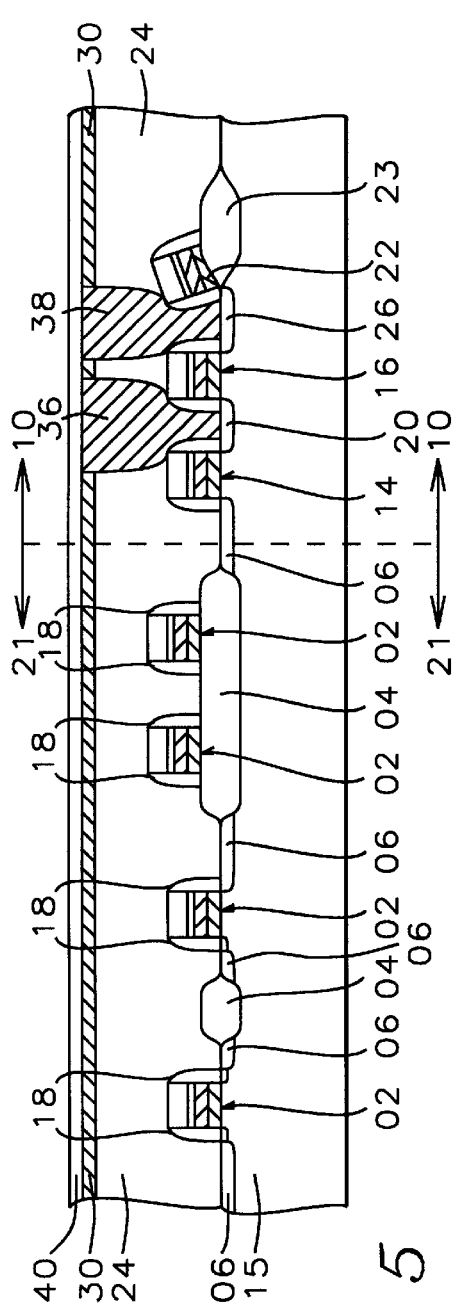
FIG. 5 shows the deposition and planarization of the first layer of Inter Poly Oxide (IPO-1).

FIG. 5 shows the completion of the deposition and planarization of IOP-1 layer 40. This layer can contain a plasma enhanced $SiO_2$. Layer 40 is, after planarization, typically between 1000 and 2000 Angstrom thick.

Figure 6:
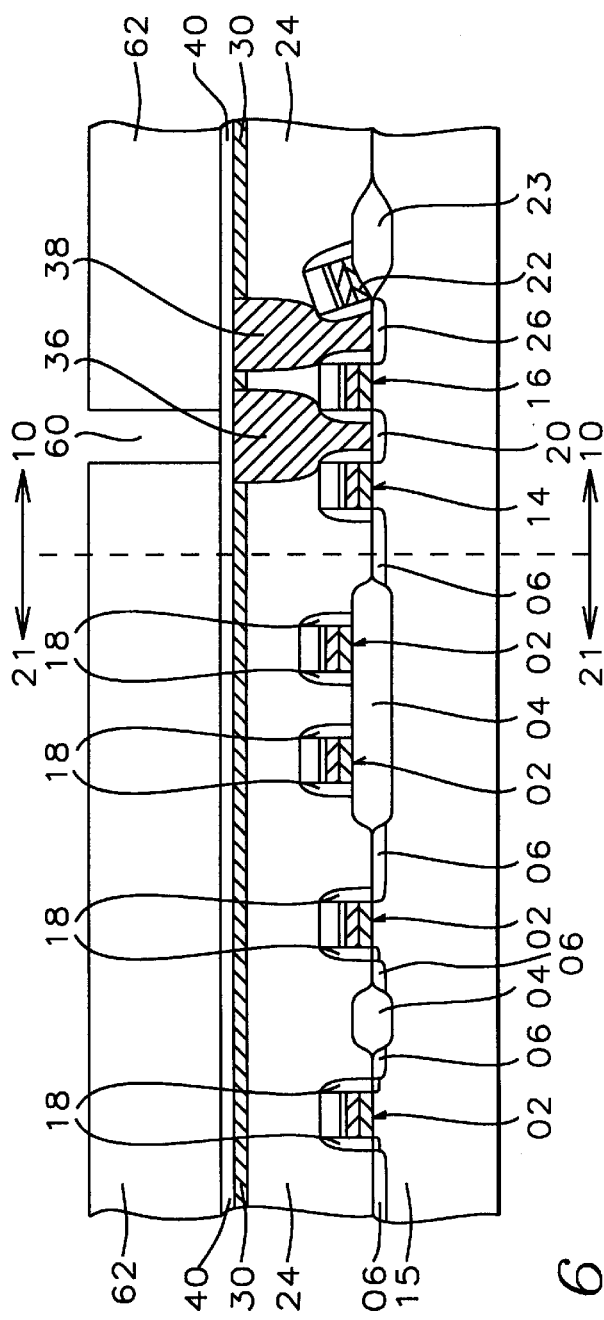
FIG. 6 shows a cross section of the bit-line contacts and the bit-line.

FIG. 6 shows deposition of a layer of photo resist 62 and the formation of the bit-line contact 60.

Figure 7:
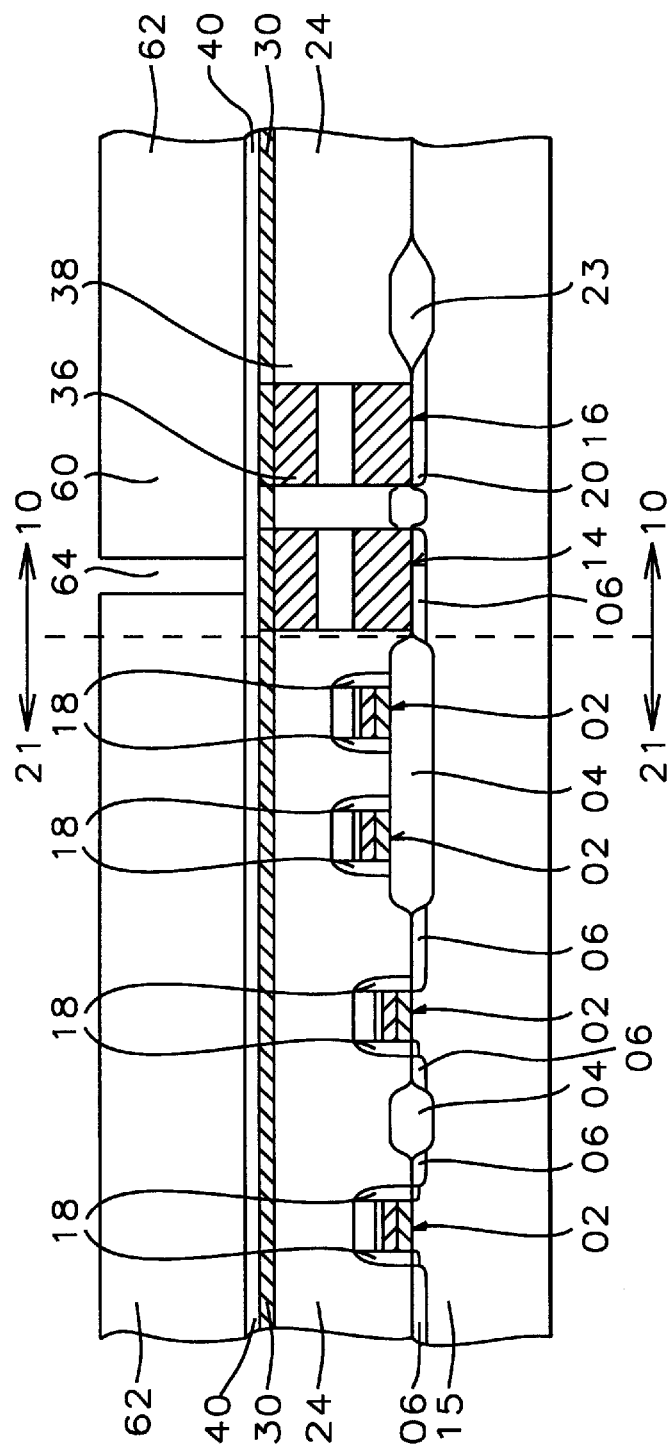
FIG. 7 shows another cross section of the bit-line contacts and the bit-line, this cross section taken in a plane that makes an angle of 90 degrees with the plane of the cross section of FIG. 6

FIG. 7 shows the other direction of the cross-section of the formation of the bit-line contact 64, 62 is a layer of photo resist.

Figure 8:
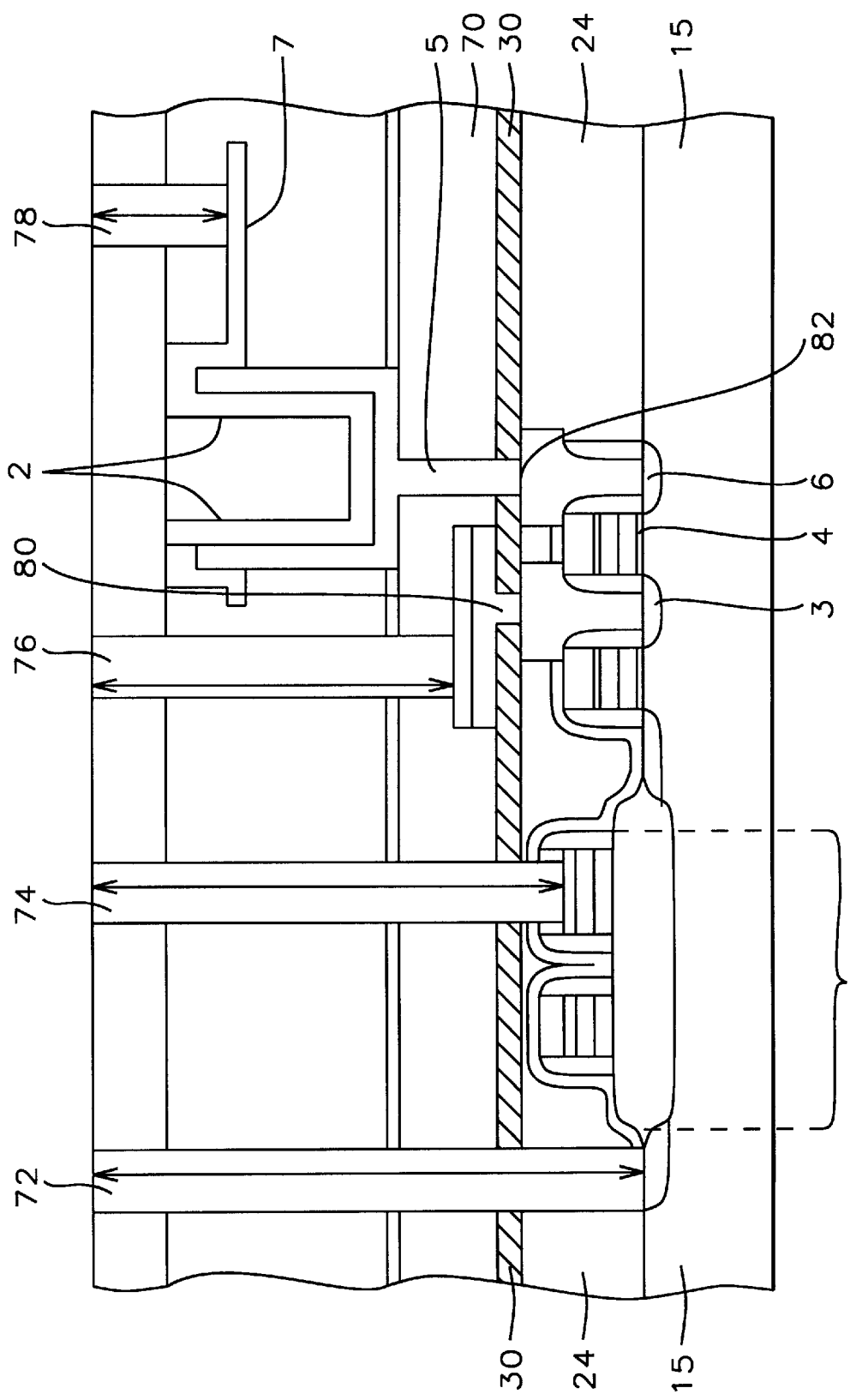
FIG. 8 shows the deposition and planarization of the second layer of Inter Poly Oxide (IPO-2) and the formation of the charge-node contacts.

FIG. 8 shows the IPO-2 deposition and planarization of layer 70 together with the formation of the contact nodes 72, 74, 76 and 78 for metal contacts. FIG. 8 is a cross section of a DRAM structure wherein 2 forms a crown capacitor, 3 is a diffusion region connected to the bit line, 4 is a gate electrode, 5 is a charge-node contact, 6 is a diffusion region connected to the charge node and 7 is a cell plate.

The IOP-2 layer is, after planarization, typically between 4000 and 6000 Angstrom thick.

Previously shown in FIG. 2, the deposition of a liner 30. This liner 30 prevents the etch required to create the bit-line contact 80 and the charge-node contact 82 from etching through the layer of polysilicon (layer 14 and 16, FIG. 1) or into and through the substrate if the etching for the bit-line contact or charge node contact is misaligned.

It will be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. A method for forming a bit-line plug and a charge-node plug in an active region of a DRAM structure formed on the surface of a semiconductor substrate said active region containing gate electrodes, comprising the following steps:

forming a word-line in said DRAM structure;

forming gate electrode spacers adjacent to and connected with said gate electrodes;

depositing a layer of dielectric over said gate electrode thereby including said gate spacers thereby further including the exposed portions of said semiconductor surface;

planarizing said layer of dielectric;

depositing a layer of liner on top of said layer of dielectric;

depositing a first layer of photoresist on top of said layer of liner;

patterning and etching self-aligned contacts within said first layer of photoresist;

forming contact plugs within said first layer of dielectric;

removing said first layer of photoresist;

depositing a first layer of IPO over said layer of liner thereby including said contact plugs;

planarizing said first layer of IPO;

depositing a second layer of photoresist over said first layer of IPO;

forming bit-line contact holes within said second layer of photoresist;

removing said second layer of photoresist;

depositing a second layer of IPO over said first layer of IPO thereby including said bit-line contact holes;

planarizing said second layer of IPO; and forming charge-node contact holes.

2. The method of claim 1 wherein said forming a word line in said DRAM is the deposition of a layer of polysilicon using a hard mask deposition technique.

3. The method of claim 2 wherein said polysilicon contains $SiO_2$ or $SiON$ or $Si_3N_4$.

4. The method of claim 1 wherein said spacers contain $SiO_2$ or $SiON$ or $Si_3N_4$.

5. The claim of method 1 wherein said spacers contain TEOS.

6. The method of claim 1 wherein said layer of dielectric contains $SiO_2$.

7. The method of claim 1 wherein said liner contains $SiON$ or $Si_3N_4$.

8. The method of claim 1 wherein said self-aligned contacts are self-aligned with said gate electrodes.

9. The method of claim 1 wherein said contact plugs contain a self-aligned contact plug in contact with said bit-line furthermore containing a polysilicon plug in contact with the charge-node contact.

10. The method of claim 1 wherein said contact plugs contain a poly silicon plug in contact with said bit-line furthermore containing a poly silicon plug in contact with the charge-node contact.

11. The method of claim 1 wherein said first layer of inter poly oxide (IPO) contains Plasma Enhanced silicon dioxide (PE $SiO_2$).

12. The method of claim 1 wherein said second layer of inter-poly oxide (IPO) contains silicon dioxide ($SiO_2$).

13. The method of claim 1 wherein said charge-node plug physically contacts said active region.

14. A method of forming self-aligned bit-line and charge-node contacts within a DRAM structure said DRAM structure containing gate electrodes, comprising:

providing a semiconductor substrate;

preparing said substrate for liner deposition within said DRAM structure;

depositing a liner over said DRAM structure and on the surface of the layer of dielectric that forms part of said preparing said substrate for liner deposition;

forming contact plugs within said DRAM structure;

forming bit-line contact within said DRAM structure by depositing and planarizing first layer of IPO, by depositing a second layer of photoresist over said first layer of IPO, by patterning and etching said second layer of photoresist, by forming bit-line contact holes and by removing said second layer of photoresist; and forming charge-node contact within said DRAM structure.

15. The method of claim 14 whereby said substrate contains active areas said active areas comprising gate electrodes said gate electrodes forming the active section of a DRAM structure said substrate furthermore containing gate electrodes that form the supporting logic structure of said DRAM structure.

16. The method of claim 14 wherein said preparing said substrate for liner deposition is:

forming word-lines in said semiconductor substrate;

forming spacers as part of and adjacent to and in contact with said gate electrodes;

depositing a layer of dielectric over the surface of said gate electrodes thereby including said spacers thereby furthermore including the unexposed sections of the surface of said semiconductor substrate; and planarizing said layer of dielectric.

17. The method of claim 16 wherein said forming word-lines in said semiconductor substrate comprises the deposition of a layer of polysilicon over said gate electrodes of said DRAM structure thereby using hard mask deposition techniques.

18. The method of claim 17 wherein said polysilicon contains $SiO_2$ or $SiON$ or $Si_3N_4$.

19. The method of claim 16 wherein said spacers contain $SiO_2$ or $SiON$ or $Si_3N_4$.

20. The claim of method 16 wherein said spacers contain TEOS.

21. The method of claim 16 wherein said layer of dielectric contains $SiO_2$.

22. The method of claim 14 wherein said depositing a liner is depositing a layer on top of said dielectric that contains $SiON$ or $Si_3N_4$.

23. The method of claim 14 wherein said forming contact plugs is:

depositing a first layer of photo-resist over said layer of liner;

patterning and etching self-aligned contacts within said first layer of photoresist;

forming contact plugs in said dielectric layer; and removing said first layer of photoresist.

24. The method of claim 23 wherein said self-aligned contacts within said layer of dielectric are self-aligned with said gate electrodes and said stacked charge capacitors.

25. The method of claim 23 wherein said contact plugs within said layer of dielectric contain a self-aligned contact plug in contact with said bit-line furthermore containing a poly silicon plug in contact with the charge-node contact.

26. The method of claim 23 wherein said contact plugs within said layer of dielectric contain a poly silicon plug in contact with said bit-line furthermore containing a poly silicon plug in contact with the charge-node contact.

27. The method of claim 14 wherein said first layer of inter-poly oxide (IPO) contains Plasma Enhanced silicon dioxide (PE $SiO_2$).

28. The method of claim 14 wherein said forming charge node contact is:

depositing and planarizing a second layer of IPO; and forming charge-node contact holes.

29. The method of claim 28 wherein said second layer of inter-poly oxide (IPO) contains silicon dioxide ($SiO_2$).

30. The method of claim 28 wherein said charge-node plug physically contacts said active region.

* * * * *